United States Patent
Dirnecker et al.

(10) Patent No.: US 9,190,462 B2
(45) Date of Patent: Nov. 17, 2015

(54) SEMICONDUCTOR DEVICE AND METHOD FOR LOW RESISTIVE THIN FILM RESISTOR INTERCONNECT

(71) Applicants: Texas Instruments Deutschland GMBH, Freising (DE); Texas Instruments Incorporated, Dallas, TX (US)

(72) Inventors: Christoph Andreas Othmar Dirnecker, Eching (DE); Leif Christian Olsen, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/492,331

(22) Filed: Sep. 22, 2014

(65) Prior Publication Data
US 2015/0008560 A1 Jan. 8, 2015

Related U.S. Application Data

(62) Division of application No. 13/463,290, filed on May 3, 2012, now Pat. No. 8,871,603.

(30) Foreign Application Priority Data

May 6, 2011 (DE) .......................... 10 2011 100 779

(51) Int. Cl.
| H01L 29/00 | (2006.01) |
| H01L 49/02 | (2006.01) |
| H01L 23/522 | (2006.01) |
| H01L 27/01 | (2006.01) |
| H01L 21/768 | (2006.01) |

(52) U.S. Cl.
CPC .......... *H01L 28/24* (2013.01); *H01L 21/76816* (2013.01); *H01L 21/76895* (2013.01); *H01L 23/5228* (2013.01); *H01L 27/016* (2013.01); *H01L 28/20* (2013.01)

(58) Field of Classification Search
CPC ................................ H01L 28/20; H01L 28/24
USPC .................................. 438/384; 257/536–537
See application file for complete search history.

(56) References Cited

U.S. PATENT DOCUMENTS

| 6,369,409 B1 | 4/2002 | Takasu et al. |
| 6,534,374 B2 | 3/2003 | Johnson et al. |
| 6,844,599 B2 * | 1/2005 | Shiiki et al. .................. 257/379 |
| 2006/0071284 A1 | 4/2006 | Tai et al. |

FOREIGN PATENT DOCUMENTS

| DE | 101 11 029 | 8/2002 |
| JP | 2007 096 352 | 4/2007 |

* cited by examiner

*Primary Examiner* — Theresa T Doan
(74) *Attorney, Agent, or Firm* — Jacqueline J. Garner; Frank D. Cimino

(57) ABSTRACT

The invention relates to a semiconductor device and a method of manufacturing an electronic device. A first conductive layer (first metal interconnect layer) is deposited. There is an insulating layer (first intermetal dielectric) layer deposited. A resistive layer is deposited on top of the insulating layer and structured in order to serve as a thin film resistor. A second insulating layer (second intermetal dielectric) is then deposited on top of the resistive layer. A first opening is etched into the insulating layers (first and second intermetal dielectric) down to the first conductive layer. A second opening is etched into the insulating layers (first and second intermetal dielectrics) down to the first conductive layer. A cross-sectional plane of the second opening is arranged such that it at least partially overlaps the resistive layer of the thin film resistor in a first direction.

9 Claims, 9 Drawing Sheets

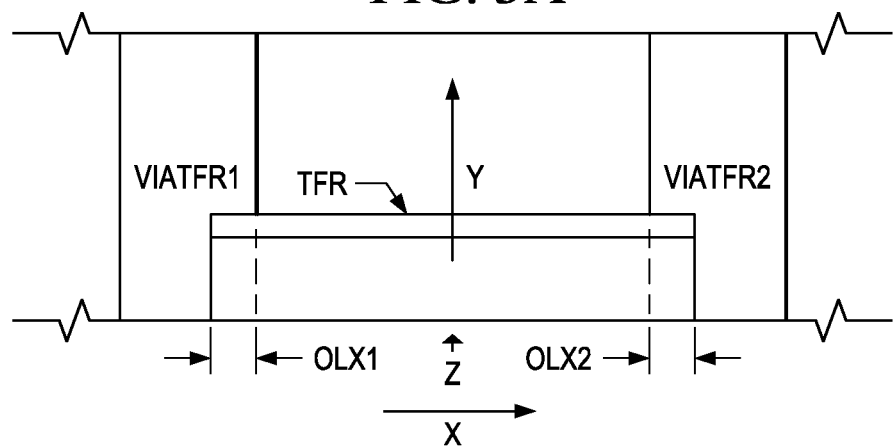
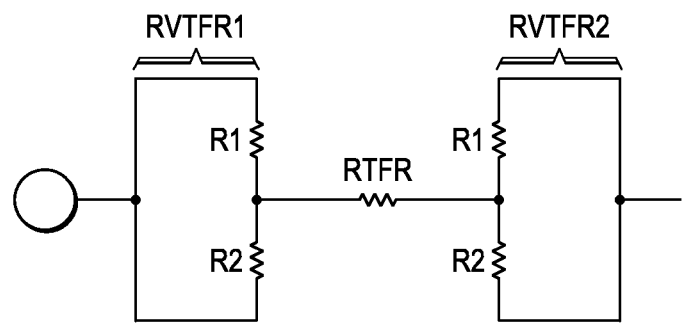

SEMICONDUCTOR DEVICE AND METHOD FOR LOW RESISTIVE THIN FILM RESISTOR INTERCONNECT

CROSS REFERENCE TO RELATED APPLICATIONS

This application is a divisional of U.S. Nonprovisional Patent Application Ser. No. 13/463,290, filed May 3, 2012, which claims the benefit of German Application no. 10 2011 100 779.6, filed May 6, 2011, the contents of which are herein incorporated by reference in its entirety.

FIELD OF THE INVENTION

The invention relates to a semiconductor device and a method for electrically connecting a low resistive thin film resistor.

BACKGROUND

Various important technological applications employ thin film resistors. These thin film resistors may be integrated in individual integrated semiconductor devices or they can be located in complex hybrid circuits or integrated circuits. Thin film resistors may be arranged as resistive ladder networks in analog-to-digital converters, or as current limiting and/or load resistors in various different circuits such as amplifiers, filters, current or voltage buffering or biasing stages etc.

Thin film resistors may comprise various different materials, as for example tantalum nitride (TaN), silicon, chromium (SiCr), or nickel chromium (NiCr). These resistor materials are generally evaporated or sputtered onto a substrate wafer at a metal interconnect level and subsequently patterned and etched. In order to use the thin film resistors, they have to be electrically connected. The parameters and performance of the thin film resistors is then related to the condition and to the quality of the resistor surface and the electrical connection. However, within the established manufacturing processes for integrated semiconductor devices, it is challenging to contact thin film resistors without impairing or destroying important parameters or even the thin film transistors themselves.

U.S. Pat. No. 6,921,962 B1 discloses a semiconductor device and a method for manufacturing a semiconductor device with a thin film resistor. As shown in FIG. 1 of the reference, conductively filled VIAs 95 extend from the upper metal interconnect layer 100 to the thin film resistors 60 and a lower metal interconnect layer 40. The VIAs are formed simultaneously, with no processing steps being added to contact resistors 60. VIAs 95 preferably contact optional portions of hard mask 70 that remain over the ends of resistor material 60. However, VIAs 95 may contact resistor material 60 and/or hard mask 70. Optional hard mask portions 70 can protect resistor material 60 during the VIA etch. Hard mask portions 70 comprise a conductive material such as titanium-tungsten (TiW), titanium-nitride (TiN) or molybdenum (Mo). Resistor material 60 can comprise materials such as tantalum-nitride (TaN), silicon-chromium (SiCr), or nickel chromium (NiCr).

U.S. Pat. No. 7,112,286 B2 discloses a thin film resistor structure which includes an electrical interface layer or head layer that is a combination of a titanium (Ti) layer and a titanium nitride (TiN) layer. The combination of the Ti layer and the TiN layer mitigates resistance associated with the electrical interface. Additionally, the employment of the Ti layer provides a more reproducible resistivity value associated with the electrical interface layer. Furthermore, the Ti layer acts as a glue layer to facilitate adhesion of the TiN to the thin film resistor material.

In order to connect lower level interconnect layers of, for example aluminum, the interconnect layers traditionally were covered by a titanium nitride layer (TiN). A hole for a VIA is then etched by a strong pre-sputter etch step in order to remove the TiN layer and reach the aluminum layer below. Subsequently, the opening for the VIA is covered with a liner of titanium (Ti) and then with a liner of TiN. Finally, the remaining space within the opening is filled with tungsten in order to electrically connect the lower level interconnect layer with a higher level. This strong pre-sputter etch for removing the TiN layer on top of the aluminum is not compatible with VIA etching for connecting a thin film resistor layer as the thin film resistor layer may easily be destroyed.

SUMMARY

It is an object of the invention, to provide a manufacturing method and a semiconductor device with an improved interconnect structure for connecting thin film resistors.

According to an aspect of the invention, a method of manufacturing an electronic device is provided. A first conductive layer (first metal interconnect layer) is deposited. There is an insulating layer (first intermetal dielectric) layer deposited on top of the first conductive layer. A resistive layer is deposited on top of the insulating layer and structured in order to serve as a thin film resistor. A second insulating layer (second intermetal dielectric) is then deposited on top of the resistive layer. A first opening is etched into the insulating layers (first and second intermetal dielectric) down to the first conductive layer. A second opening is etched into the insulating layers (first and second intermetal dielectrics) down to the first conductive layer. The horizontal cross-sectional plane (i.e. the area of the cross section of the opening in the horizontal plane) of the second opening is arranged such that it at least partially overlaps the resistive layer of the thin film resistor in a first dimension. In other words, if the layers (conductive layers, insulating layers, resistive layer) are assumed to be arranged vertically, one on top of the other, the at least partial overlap of the opening of the VIA is then in at least one direction in the horizontal plane. This arrangement can result in various different advantageous embodiments.

The material of the resistive layer can preferable comprise materials such as tantalum-nitride (TaN), silicon-chromium (SiCr), or nickel chromium (NiCr).

The layers are configured such that the first VIA and the second VIA are electrically connected at a lower side by the first conductive layer and at an upper side by the second conductive layer.

The second opening and the first opening are filled with an electrically conductive material as, for example tungsten. The first and second openings are configured to serve as VIAs (vertical electrical connections) through the intermetal dielectrics. A second conductive material can be deposited on top of the second intermetal dielectric. The second VIA electrically connects the resistive layer of the thin film resistor in the region where the horizontal cross sectional area overlaps the resistive layer of the thin film resistor. This results in an electrical connection of the second conductive layer with the thin film resistor.

The same dry etching process may then be used for etching the first and the second opening. This simplifies manufacturing and is possible since the second opening only partially overlaps the resistive layer of the thin film resistor.

The overlap between the opening of the VIA (or in other words the VIA itself) and the resistive layer of the TFR in the at least one direction in the horizontal plane is advantageously between 0.2 µm and 0.4 µm.

In an aspect of the invention, the thickness of the resistive layer for the thin film resistor may be adjusted properly to connect the VIA to the resistive layer. A thickness between 50 nm and 100 nm and more is advantageous. This provides that the resistive layer is not entirely removed during etching the VIA for connecting the resistive layer of the thin film resistor.

The second opening, or in other words the second VIA for connecting the resistive layer of the thin film resistor is then configured to electrically connect a first conductive layer below the resistive layer of the thin film resistor and a second conductive layer above the resistive layer of the thin film resistor and the thin film resistor between the two conductive layers. This aspect of the invention provides that the relative position of the resistive layer of the thin film resistor becomes irrelevant or at least less significant as the resistive layer is connected to two conductive layers embedding somehow the resistive layer. If the resistive layer is then further apart from one of the conductive layers, it is automatically closer to the other conductive layer.

A diameter or length of the second opening for connecting the TFR can be chosen (or rather increased) such that the remaining cross-sectional area of the opening (being reduced by the overlap with the resistive layer) corresponds to the cross-sectional area of the normal VIA. The resistance of the connection to the first conductive layer is then not reduced by the overlap compared with the normal configuration which decreases the contact area between the VIA and the second conductive layer.

According to another aspect of the invention, the dimension of the second opening or the second VIA in a second direction in the horizontal plane can be greater than the dimension of the resistive layer in this direction. This means that the diameter of the VIA can extend over (be larger than) the resistive layer on both sides in this second direction. This provides that there is a larger tolerance for the position of the dimensions of the resistive layer relative to the VIA. The resistance of the connection between the VIA and the resistive layer is then less independent of the exact position of the resistive layer with respect to the VIA. The width of the second VIA in the second direction may be 0.4 µm.

Advantageously, a plurality of first openings can be provided. This plurality of first openings can be configured as an array of first opening. This plurality of first opening may then be configured to connect the first conductive layer and the second conductive layer. This can reduce the parasitic resistance between of the interconnection between the second conductive layer and the first conductive layer, thereby reducing the parasitic resistance of the interconnection leading from the thin film resistor to the first conductive layer and from there to the second conductive layer.

The invention also provides an electronic device that is manufactured according to the aspects and embodiments of the invention. The electronic device may comprise a first conductive layer (e.g. lower level metal, MET1), a first intermetal dielectric layer on top of first conductive layer, a resistive layer of a thin film resistor on top of the first intermetal dielectric, a second intermetal dielectric layer on top of the resistive layer, and a second conductive layer (higher level metal, MET2). A first VIA is provided through the second intermetal dielectric and the first intermetal dielectric layer down to the first conductive layer for electrically connecting the first conductive layer. A second VIA is provided that leads through at least the second intermetal dielectric layer down to the first conductive layer. A horizontal cross-sectional plane of the second VIA can then at least partially overlap the resistive layer of the thin film resistor. The cross-sectional plane is coplanar to the horizontal plane, if the direction in which the layers are stacked on top of each others are considered the vertical direction being perpendicular to the horizontal plane.

The resistive layer of the thin film resistor can have a substantially rectangular shape and the partial overlap of the horizontal cross-sectional plane of the second VIA can extend beyond a circumferential outer edge of the resistive layer of the thin film resistor at three sides of the resistive layer of the thin film resistor.

The first VIA and the second VIA are electrically connected at a lower side by the first conductive layer. The first VIA and the second VIA are electrically connected at an upper side by the second conductive layer.

BRIEF DESCRIPTION OF DRAWINGS

Further aspects and characteristics of the invention will ensue from the following description of preferred embodiments of the invention with reference to the accompanying drawings, wherein FIGS. 3A-3B show a simplified cross-sectional view and illustrative circuit diagram of a second embodiment of the invention.

DETAILED DESCRIPTION OF PREFERRED EMBODIMENTS

Figure 1A:
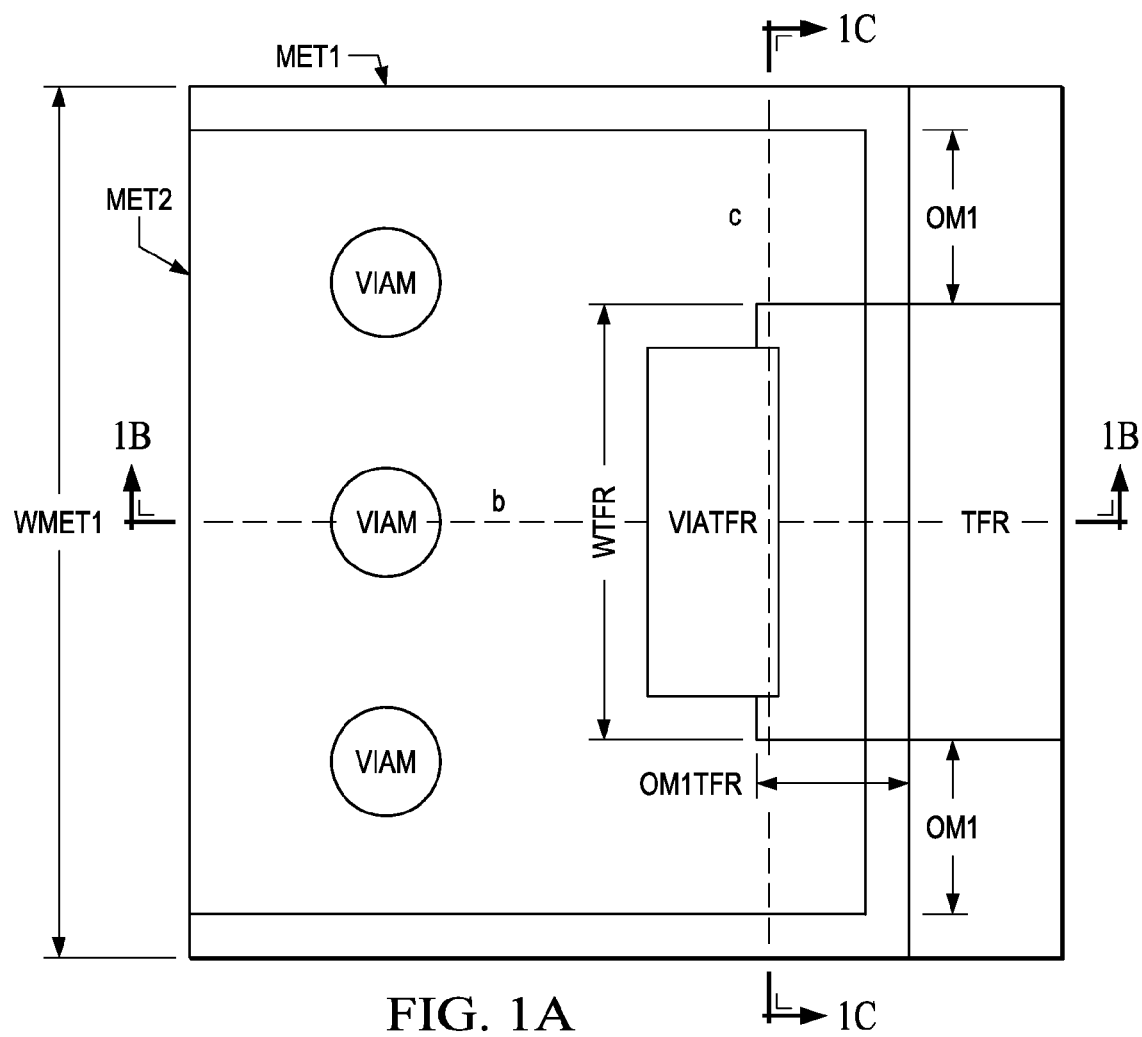
FIGS. 1A-1C show a simplified sectional view and two cross-sectional views of a first embodiment of the invention.
Figure 1B:
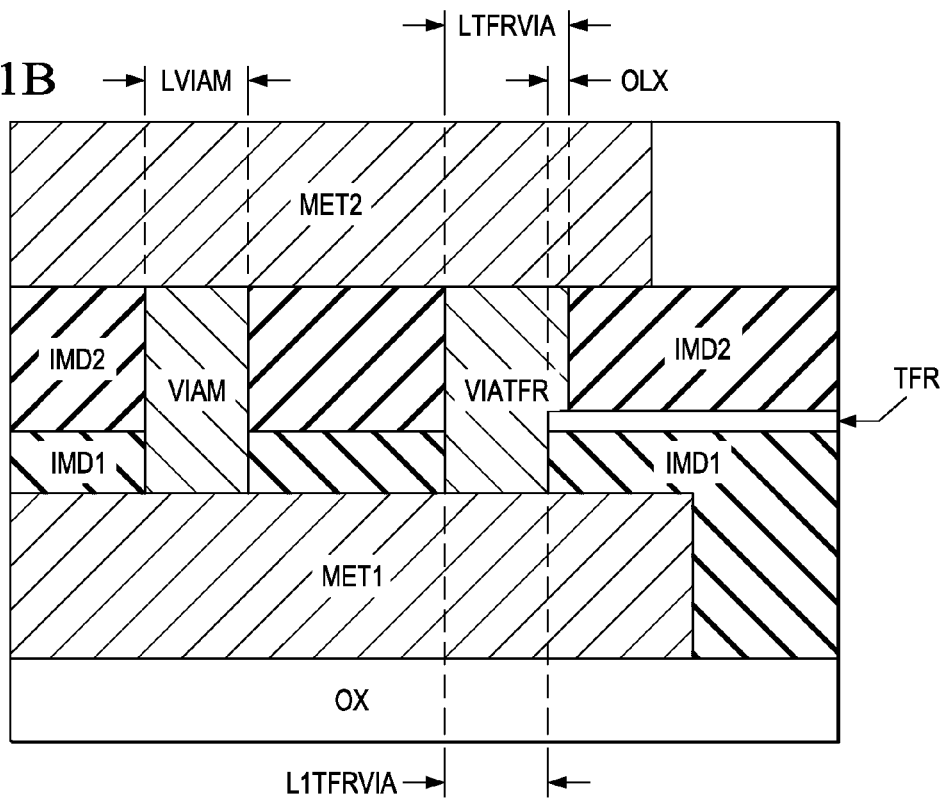
Figure 1C:
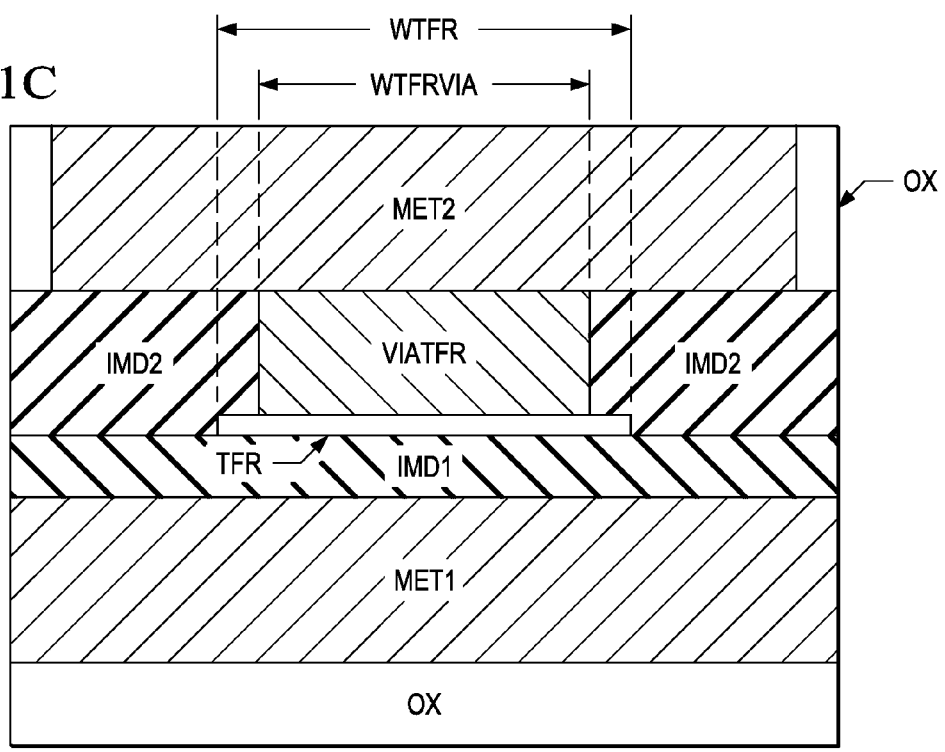

FIGS. 1A-1C show a top view (1A) and two cross-sectional views (1B, 1C) of a first embodiment of the invention. There is an electronic device comprising a thin-film resistor TFR, a first metal layer MET1, a second metal layer MET2 and two VIAs: VIAM and VIATFR. The VIA VIAM connects the first metal layer MET1 and the second metal layer MET2. The VIA VIATFR connects the second metal layer MET2 and the thin-film resistor layer TFR. FIG. 1 (A) shows a sectional top view of the first embodiment. The thin-film resistor layer TFR is rectangular and overlaps the first metal layer MET1 by a length OM1TFR. The width of the thin-film resistor layer TFR is WTFR. The width of the first metal layer is WMET1. The first metal layer MET1 and the second metal layer MET2 are connected by metal interconnect VIAs VIAM. FIG. 1A indicates a longitudinal direction which is indicated by dashed line and arrow b. It further indicates a lateral direction by a dashed line and arrow c. FIG. 1B shows the cross-sectional view of a cut along the longitudinal direction b. FIG. 1C shows a cross-sectional view along the lateral direction c. All following Figures except FIG. 3 and FIG. 4 follow this principle. Accordingly, (A) is the sectional top view, (B) is the cross-sectional view along a cut in longitudinal direction along arrow b and (C) is the cross-sectional view in lateral direction along arrow c.

During manufacturing, the conductive layer MET1 is deposited. After structuring the first conductive metal layer MET1. An insulating layer, for example a first intermetal dielectric IMD1, is deposited on top of the first conductive layer. A resistive layer for a thin-film resistor is deposited and structured. Another insulating layer, for example a second intermetal dielectric IMD2 is applied and structured. Finally, a dry etching step is performed during which the openings for the intermetal VIA VIAM and the VIA for connecting the thin-film resistor layer TFR VIATFR are provided. Finally, the remaining space within the VIAs is filled with a conductive material as, for example tungsten. It possible to use the same dry etching step for both VIAs: VIAM and VIATFR.

The VIA TFR is partially overlapping the thin-film resistor layer TFR in longitudinal direction. The length of the VIA in longitudinal direction is LTFRVIA. Between conductive layer MET2 and the thin-film resistor layer TFR the VIA VIATFR has a length of LTFRVIA. Between the thin-film resistor layer TFR and conductive layer MET1 the length in longitudinal direction is then reduced to L1TFRVIA. This is due to the fact that the VIA VIATFR overlaps the thin-film resistor layer TFR by a certain amount OLX=LTFRVIA-L1TFRVIA.

The width of the VIA VIATFR in lateral direction is WTFRVIA. As shown in FIG. 1C, the width of VIATFR is smaller than the width WTFR of the thin-film resistor layer TFR. The partial overlap in the first dimension, i.e. in longitudinal direction provides sufficient electrical connection between VIATFR and the thin film resistor TFR.

The first VIAs VIAM are configured as array (plurality) of VIAs. This reduces the parasitic resistance of the interconnection from the second conductive layer MET2 to the first conductive layer MET1 and from there to the resistive layer. The second conductive layer MET2 is usually the layer which is used to connect the resistor.

FIG. 1B shows that the upper ends of the first VIAs VIAM and the second VIAs VIATFR are electrically connected by the second conductive layer MET2. The lower ends of the first VIAs VIAM and the second VIAs VIATFR are electrically connected by the first conductive layer MET2.

Figure 2A:
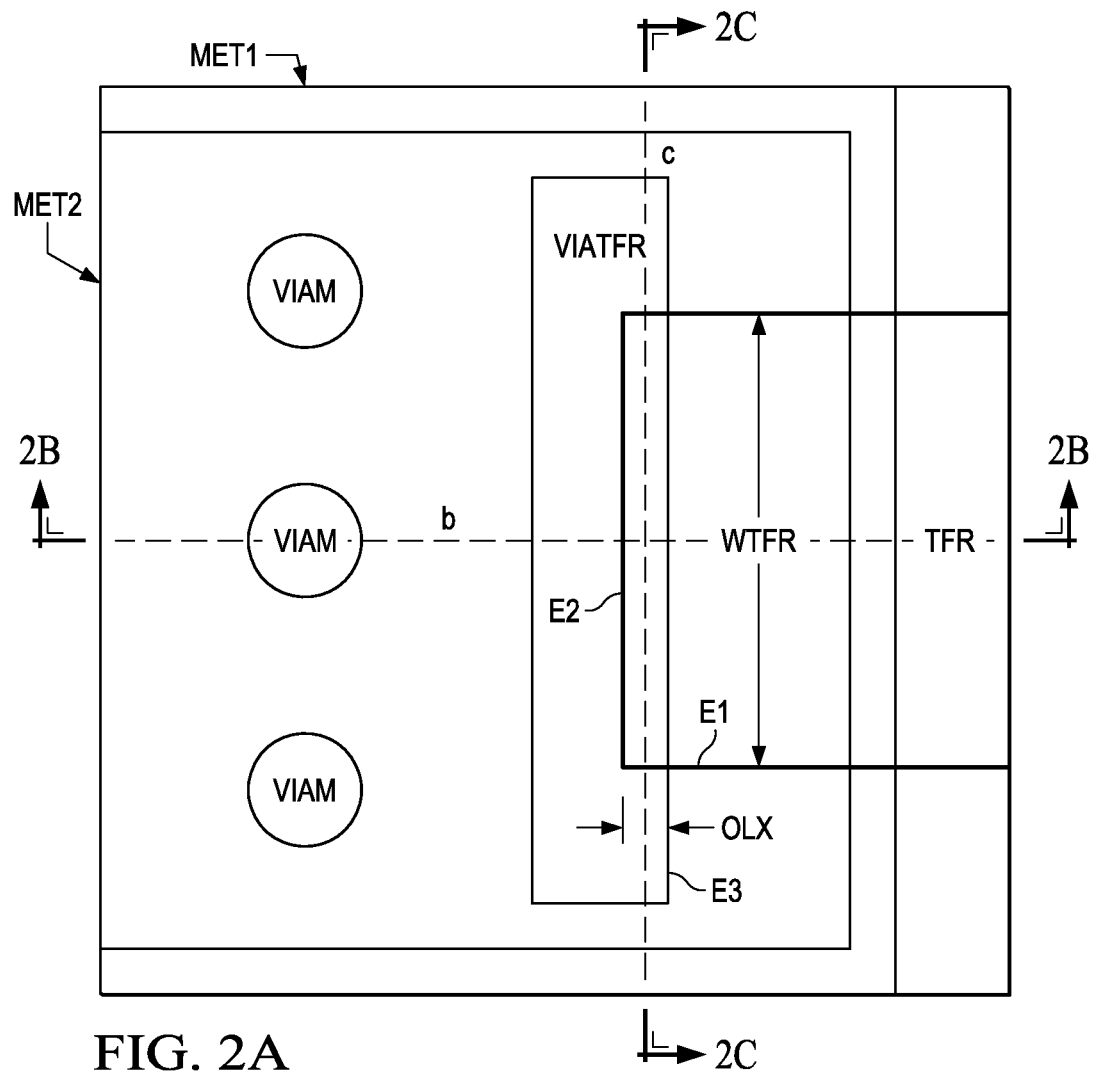
FIGS. 2A-2C show a simplified sectional top view and two cross-sectional views of a second embodiment of the invention.
Figure 2B:
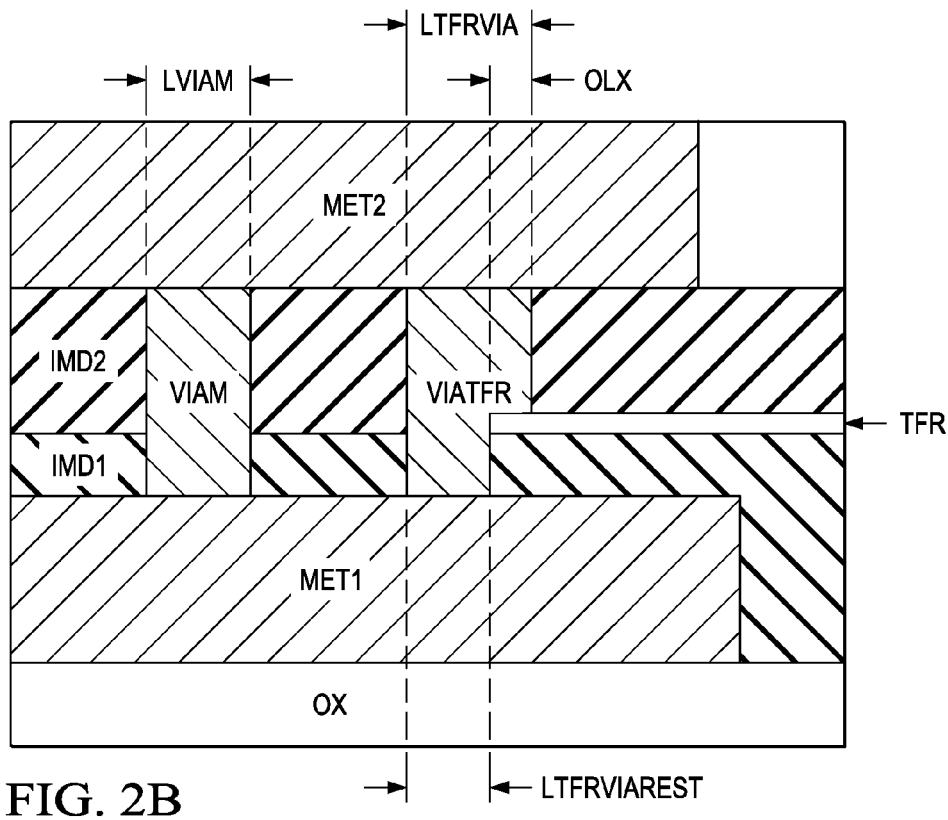
Figure 2C:
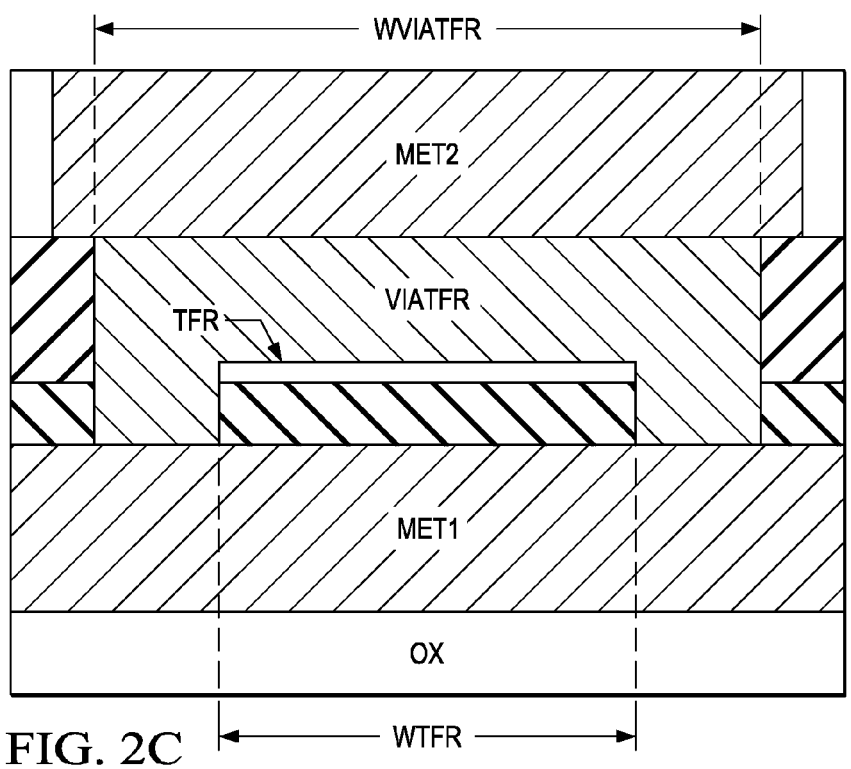

FIG. 2A-2C show a second embodiment of the invention. Also in this embodiment, VIATFR has a rectangular shape. VIATFR partially overlaps the thin-film resistor layer by a length OLX in longitudinal direction. This is shown in FIG. 2A on the right side. Furthermore, the width WVIATFR of VIATFR is now greater than the width WTFR of the thin-film resistor layer. This provides that the contact area between TFR and VIATFR is always maximum in lateral direction. The cross sectional area of VIATFR is dimensioned in order to extend beyond the circumferential edges of the resistive layer of the TFR on three edges E1, E2 and E3.

A possible parameter range for the dimensions can be: 0.2 μm≤OLX≤LTFRVIAREST, which means that the length OLX of the overlap in longitudinal direction should not be smaller than 0.2 μm and not greater than a minimum residual diameter LTFRVIAREST. LTFRVIAREST is diameter of TFRVIA in longitudinal direction minus the length of the overlap OLX. This remaining diameter LTFRVIAREST can be equal to the normal diameter LVIAM in longitudinal direction of VIAM.

FIG. 3A shows a cross-sectional view along the lateral direction c of the embodiment of FIGS. 2A-2C over the full length of TFR. There are to similar VIAs VIATFR1 and VIATFR2 for electrically connecting the thin film resistor TFR from both sides. FIG. 3B shows a simplified circuit diagram of resistors representing the resistance of the thin film resistor RTFR and the resistances RVTFR1 and RVTFR2 of the two interconnections provided by VIATFR1 and VIATFR2. The resistors R1 represent the resistance of the interconnection between the TFR and MET2 and R2 represents the resistance of the interconnection between TFR and R1. If the TFR is now displaced (misaligned) in longitudinal direction as indicated by vector X, the length of the overlap OLX1 on one side of the TFR can increase, but at the same time the length of the overlap OLX2 on the other side decreases. This means that the resistance of the interconnection between VIATFR and the TFR decreases on side, but increases by the same amount on the other side. The sum of the interconnect resistance remains the same. The same applies if the TFR is misaligned in vertical direction as indicated by vector Y. Resistors R2 may then increase, but at the same time, resistors R1 decrease and the total resistance remains the same. As long as the overlap in lateral direction (indicated by vector Z) is large enough and extends beyond the edges (E1, E3 shown in FIG. 2 (A)), a misalignment in this direction, does not affect the interconnect resistances RVTFR1 and RVTFR2.

Figure 4:
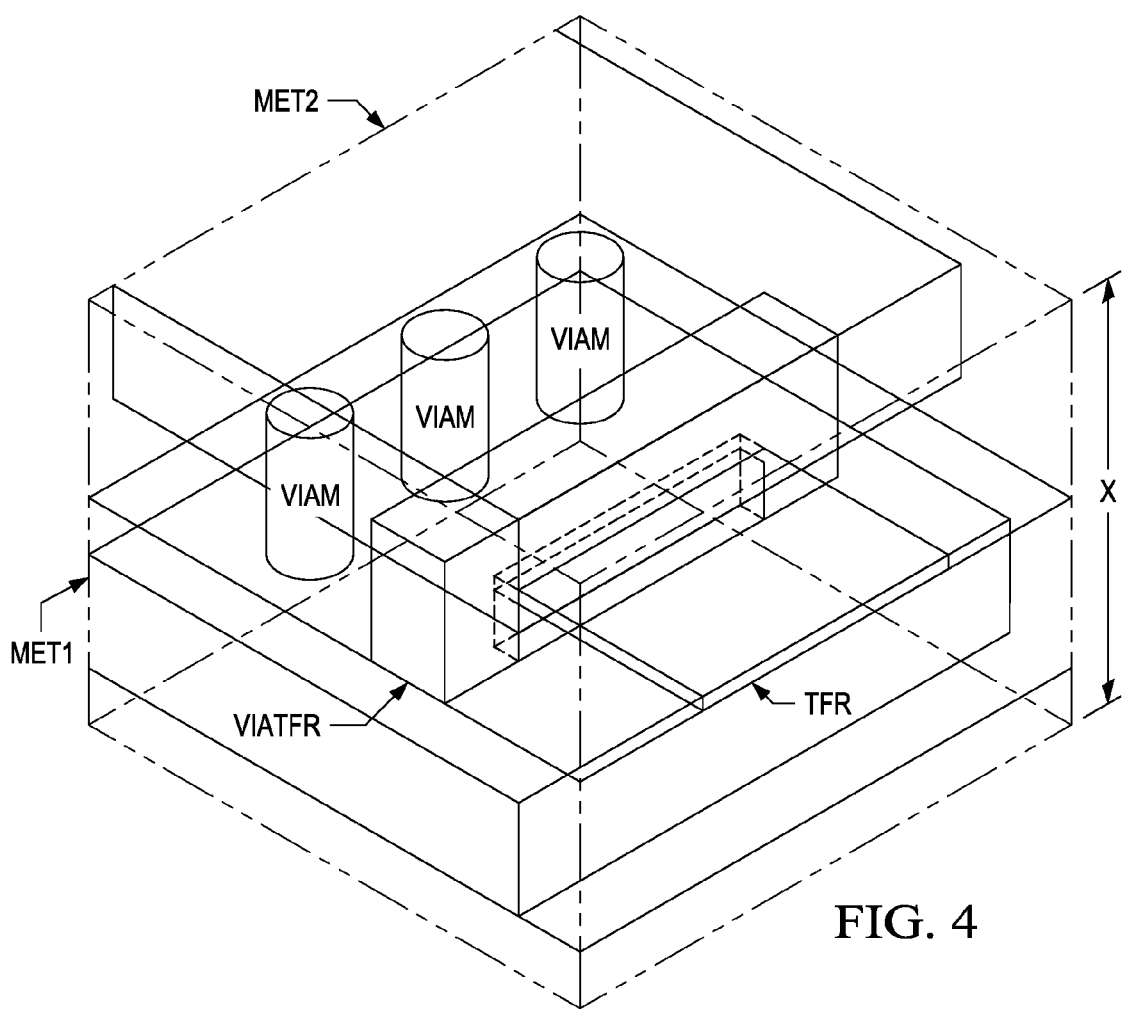
FIG. 4 shows a simplified sectional perspective view of the second embodiment of the invention.

FIG. 4 shows a perspective view on the embodiment of FIG. 2A-2C. VIATFR connects the two conductive layers MET2 and MET1 and overlaps partially the thin-film resistor layer TFR. Therefore, the exact position in vertical direction X of TFR becomes less relevant. If the thin-film resistor layer TFR is farther away from one conductive layer, it is automatically closer to the other one. The variations of the interconnect resistance are thereby reduced compared with solutions, where the TFR is only connected to one metal interconnect.

The overlap OLX between the cross-sectional area of the opening of VIATFR in the first direction may be between 0.2 μm and LTFRVIAREST.

The thickness of the resistive layer of the TFR may be about 50 nm. The may even range down to 30 nm.

The width WVIATFR of the VIATFR may be between 0.2 μm and 0.5 μm, in particular 0.4 μm.

The width and length or the diameter of VIATFR is advantageously chosen such the part of the VIA that connects the resistive layer of the TFR with the first conductive layer MET1 is still large enough, in particular as large as usual. The dimensions of the opening may then be chosen such that the reduction of the area of the cross-sectional plane of the opening due to the overlap with the resistive layer is compensated. The opening for the VIATFR may then be increased in order to compensate for the loss due to the overlap with the resistive layer on the way down to the first conductive layer.

FIG. 5 and FIG. 6 show a non-exhaustive sequence of intermediate manufacturing stage which may be performed in order to manufacture the integrated electronic device according to the second embodiment shown in FIG. 2 and FIG. 4.

Figure 5A:
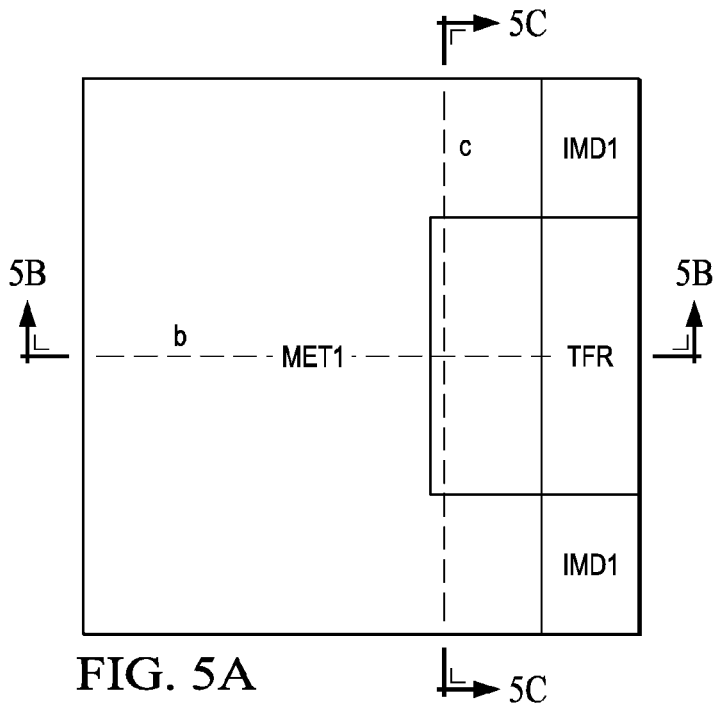
FIGS. 5A-5C show a sectional top view and two cross-sectional views of a first intermediate manufacturing stage of the second embodiment of the invention.
Figure 5B:
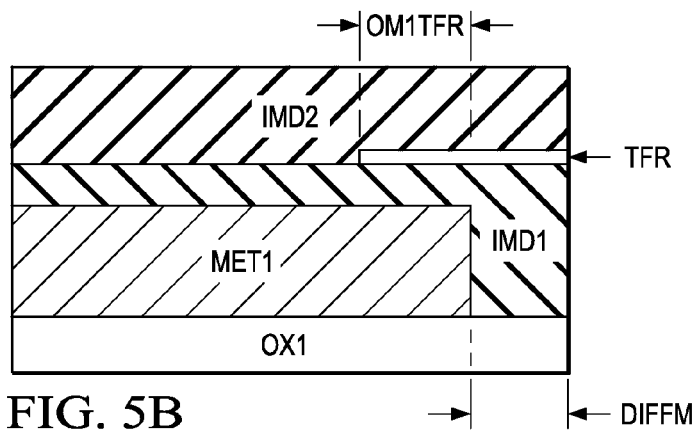
Figure 5C:
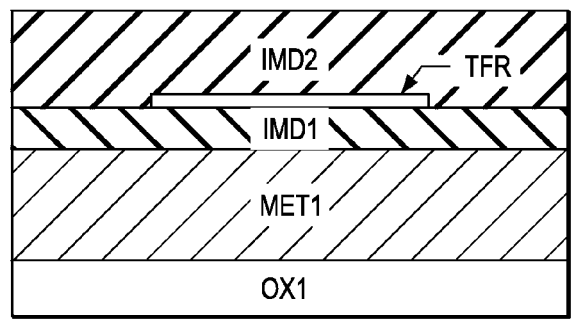

FIGS. 5A-5C show a first intermediate manufacturing stage. The lower metal is the first conductive layer MET1, which is located on top of an active area of the integrated circuit covered by at least an oxide OX1. The conductive layer MET1 is structured by use of masks and photoresist as known in the art. In the next step the lower metal level is finalized. The structured metal layer MET1 is a little bit shorter (by DIFFMET1) in longitudinal direction (along a cut indicated by arrow (c)). A first intermetal dielectric IMD1 is applied on the first conductive layer MET1 and planarized by a chemical mechanical polishing step. A cleaning step follows. The resistive layer for the thin film resistor TFR is deposited and structured. The thin film resistor layer TFR is deposited on top of the planarized intermetal dielectric. The structuring is performed by applying photoresist and etching steps as known in the art. The TFR overlaps the first conductive layer MET1 by a length OM1TFR in longitudinal direction. A further intermetal dielectric IMD2 is deposited and planarized.

Figure 6A:
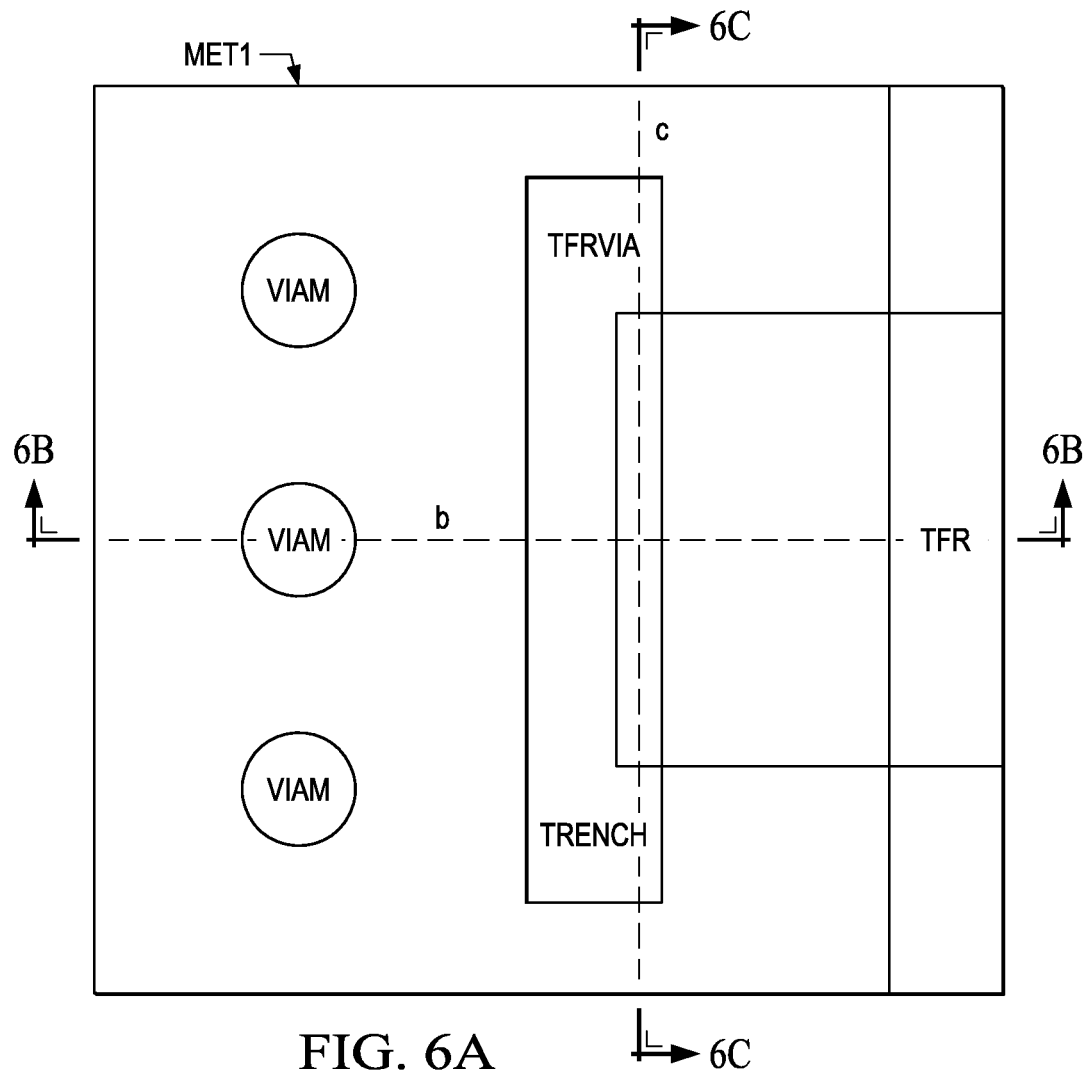
FIGS. 6A-6C show a sectional top view and two cross-sectional views of a second intermediate manufacturing stage of the second embodiment of the invention.
Figure 6B:
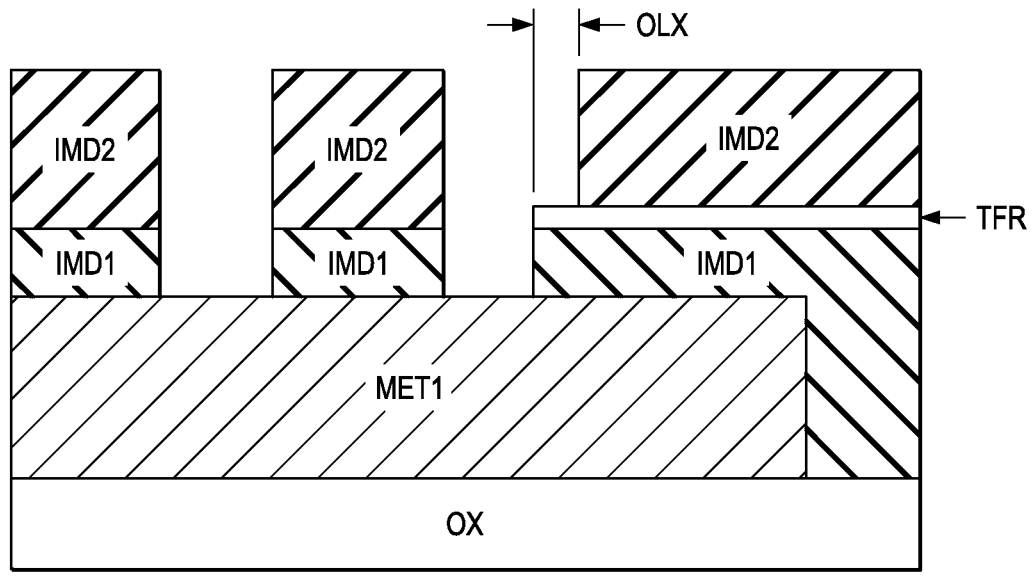
Figure 6C:
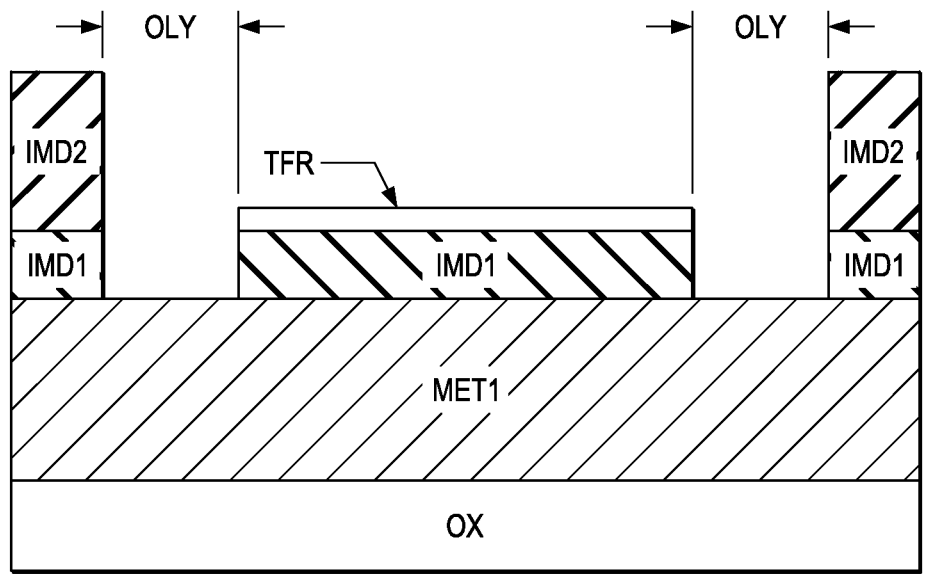

FIGS. 6A-6C show the structure obtained by further manufacturing steps. The pattern for the VIATFR is defined. The shape of the VIA is rectangular. The photoresist is applied to define the rectangular opening. The opening is arranged such that the VIA is entirely located within the MET1 layer so that once it is etched down to MET1, VIATFR would reach MET1 over its whole cross-sectional area. However, the opening is also located such that it partially overlaps the thin film resistor layer TFR in longitudinal direction (along longitudinal cut (c)) by an amount OLX.

After etching the opening for VIATFR, the opening for VIATFR reaches down to MET1. As it overlaps the TFR, there is a small shoulder where IMD2 does not cover the TFR but the TFR is still supported by IMD1. In lateral direction the opening is larger than the TFR on both sides of the TFR by an amount OLY.

The pattern definition and finalization of the VIAM is then performed. This step includes applying photoresist, exposure, developing, etching, an ashes step and cleanup. The two openings for the VIAM and VIATFR are now prepared.

The openings for VIAM may be etched first or VIAM and VIATFR may be etched at the same time. The same dry etching step may here be used as the opening of the TFR overlaps the TFR only by a small amount. The VIAs (VIAM and VIATFR) are then filled. The step comprises barrier deposition and tungsten fill (W-fill), a tungsten CMP step and cleanup.

FIGS. 2A-2C shows the final result in which the TFR is electrically connected through VIATFR to the first conductive layer MET1 and the second conductive layer MET1. The level of the thin film resistor is located between the levels of the first conductive layer MET1 and the second conductive layer MET2. The filling of VIATFR connects the TFR on the top side and on a lateral side.

Although the invention has been described hereinabove with reference to a specific embodiments, it is not limited to these embodiments and no doubt further alternatives will occur to the skilled person that lie within the scope of the invention as claimed.

The invention claimed is:

1. An electronic device comprising:
   a first conductive layer;
   a first intermetal dielectric layer on top of the first conductive layer;
   a resistive layer of a thin film resistor on top of the first intermetal dielectric;
   a second intermetal dielectric layer on top of the resistive layer;
   a second conductive layer on top of the second intermetal dielectric;
   a first VIA through the second intermetal dielectric and the first intermetal dielectric layer for electrically connecting the first conductive layer and the second conductive layer; and
   a second VIA through the second intermetal dielectric layer and the first intermetal dielectric down to the first conductive layer, wherein the second VIA partially overlaps the resistive layer of the thin film resistor in at least a first dimension to electrically connect the thin film resistor to the first conductive layer and the second conductive layer, and wherein the first VIA does not overlap the resistive layer.

2. The electronic device according to claim 1, wherein the resistive layer of the thin film resistor has a substantially rectangular shape and the partial overlap of the second VIA extends beyond a circumferential outer edge of the resistive layer of the thin film resistor at three sides of the resistive layer of the thin film resistor.

3. The electronic device of claim 1, wherein the first VIA is a circular via and the second via is a rectangular via.

4. A semiconductor device comprising:
   a first metal layer;
   a first intermetal dielectric layer on top of the first metal layer;
   a resistive layer of a thin film resistor on top of the first intermetal dielectric;
   a second intermetal dielectric layer on top of the resistive layer;
   a second metal layer on top of the second intermetal dielectric;
   a first VIA through the second intermetal dielectric and the first intermetal dielectric layer for electrically connecting the first metal layer and the second metal layer, wherein the first VIA does not overlap the resistive layer; and
   a second VIA through the second intermetal dielectric layer and the first intermetal dielectric down to the first metal layer, wherein the second VIA partially overlaps the resistive layer of the thin film resistor in at least a first dimension to electrically connect the thin film resistor to the first metal layer and the second metal layer and wherein a width of the second VIA is wider than a width of the resistive layer of the thin film resistor.

5. The semiconductor device according to claim 4, wherein the resistive layer of the thin film resistor has a substantially rectangular shape and the partial overlap of the second VIA extends beyond a circumferential outer edge of the resistive layer of the thin film resistor at three sides of the resistive layer of the thin film resistor.

6. The semiconductor device of claim 4, wherein the first VIA is a circular via and the second via is a rectangular via.

7. An integrated circuit comprising:
   a first metal layer;
   a first intermetal dielectric layer on top of the first metal layer;
   a resistive layer of a thin film resistor on top of the first intermetal dielectric;
   a second intermetal dielectric layer on top of the resistive layer;
   a second metal layer on top of the second intermetal dielectric;
   a first VIA through the second intermetal dielectric and the first intermetal dielectric layer for electrically connecting the first metal layer and the second metal layer, wherein the first VIA does not overlap the resistive layer; and
   a second VIA through the second intermetal dielectric layer and the first intermetal dielectric down to the first metal layer, wherein the second VIA partially overlaps the resistive layer of the thin film resistor in at least a first dimension to electrically connect the thin film resistor to the first metal layer and the second metal layer and wherein a width of the second VIA is wider than a width of the resistive layer of the thin film resistor.

8. The integrated circuit of claim 7, wherein the resistive layer of the thin film resistor has a substantially rectangular shape and the partial overlap of the second VIA extends beyond a circumferential outer edge of the resistive layer of the thin film resistor at three sides of the resistive layer of the thin film resistor.

9. The integrated circuit of claim 7, wherein the first VIA is a circular via and the second via is a rectangular via.

* * * * *